(12) United States Patent
Bowers et al.

(10) Patent No.: US 6,292,123 B1
(45) Date of Patent: *Sep. 18, 2001

(54) DIGITAL-TO-ANALOG CONVERTER WITH CMOS-COMPATIBLE POWER-ON RESET CIRCUIT

(75) Inventors: Derek F. Bowers, Sunnyvale; Azita Ashe, Saratoga, both of CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/746,794

(22) Filed: Dec. 21, 2000

Related U.S. Application Data

(63) Continuation of application No. 09/359,512, filed on Jul. 23, 1999.

(51) Int. Cl.[7] .................................................. H03M 1/66
(52) U.S. Cl. ................................................ 341/144; 327/143
(58) Field of Search .............................. 341/144; 327/143

(56) References Cited

U.S. PATENT DOCUMENTS

| | | | |
|---|---|---|---|
| 4,754,166 | 6/1988 | Nagano | 307/296 R |
| 5,039,875 | 8/1991 | Chang | 307/272.3 |
| 5,100,817 | 3/1992 | Cederbaum et al. | 438/152 |
| 5,349,244 | 9/1994 | Confalonieri | 307/296.4 |
| 5,602,502 | 2/1997 | Jiang | 327/143 |
| 5,721,502 | 2/1998 | Thomson et al. | 327/143 |
| 5,883,532 | 3/1999 | Bowers | 327/143 |

OTHER PUBLICATIONS

Paul Horowitz, Winfield Hill, *The Art of Electronics*, Second Edition, Cambridge University Press, New York, pp. 614–616, 1989.

*Primary Examiner*—Howard L. Williams
*Assistant Examiner*—Jean Bruner Jeanglaude
(74) *Attorney, Agent, or Firm*—Koppel & Jacobs

(57) ABSTRACT

A power-on reset circuit employs all-CMOS circuitry to initiate a reset signal when the circuit's power supply voltage is low, and terminate the signal in response to the supply voltage exceeding a reference voltage by at least the greater of the threshold voltages of PFET and NFET transistors employed in the circuit. A diode-connected bipolar transistor is implemented with an FET-compatible circuit structure to establish the reference voltage, which compensates for the possibility of fabrication tolerances.

12 Claims, 3 Drawing Sheets

DIGITAL-TO-ANALOG CONVERTER WITH CMOS-COMPATIBLE POWER-ON RESET CIRCUIT

RELATED APPLICATION

This is a continuation of application Ser. No. 09/359,512, filed Jul. 23, 1999.

BACKGROUND OF THE INVENTION

1. Field of the Invention

This invention is related to the provision of a power-on reset signal for electronic circuits.

2. Description of the Related Art

Power is often supplied to electronic systems in a gradual fashion for a number of reasons, e.g., the need to limit in-rush currents, limits on power availability, etc. During the time that power gradually "ramps up", i.e., the power supply voltage increases to its final value, circuitry may toggle somewhat randomly, leaving an entire system in an unknown state when power has been fully supplied to the system. Furthermore, the rate at which power is supplied varies from system to system, as does the final value of the power supply voltage.

Power-on reset signals are used to ensure that an electronic circuit does not begin operation until the power supply voltage reaches a level that permits proper operation. Digital circuitry, from the lowest level of integration such as the "glue" logic required to provide an interface between complex digital systems, to the highest levels of integration exemplified by the most complex microprocessors available, requires an "all clear" signal that indicates to the circuitry when operation may safely commence. Without such a signal the somewhat random toggling of digital circuitry that occurs during the time that power is gradually applied to the system could be interpreted as meaningful data or instructions, with possibly catastrophic consequences. A power-on reset signal may be employed to place registers and other circuits in a predetermined state, to provide a baseline from which to operate and, possibly, to suppress undesirable output signals.

FIG. 1 illustrates a conventional approach to creating a power-on reset signal. A delay circuit 2 includes a resistor 3 and a capacitor 6 connected in series between a positive voltage supply terminal $V_{dd}$ and a negative voltage supply terminal nominally designated as ground (gnd), with the resistor/capacitor (RC)'s tap connected to the input of an inverter 4. The capacitor 6 is connected between the inverter input and ground. As the power supply voltage (between Vdd and ground) increases, the tap voltage of the RC circuit follows it. Once the RC tap voltage reaches the input HI threshold voltage of the inverter, the inverter output goes LO, thus providing an active low power-on reset signal which, ostensibly, indicates that the power supply voltage has reached a level which is acceptable for normal circuit operation.

In fact, this circuit provides the power-on reset signal only indirectly. The voltage at the input of the inverter 4 does not directly track the power supply voltage. This is, the voltage at the inverter input is not a fixed ratio of the power supply voltage; rather it is a delayed version of it. The voltage at the inverter input depends upon the RC time constant, not directly upon the input voltage. Some RC time constant after Vdd passes the inverter's input threshold, the delayed version of the power supply voltage at the inverter input reaches the inverter's input HI threshold voltage. If the capacitor 6 is too small, the input voltage could reach the inverter's threshold before the power supply voltage has reached an adequate level. Because it is important to be sure that the power supply voltage has reached its minimum acceptable level before commencing operation, the capacitor 6 is often chosen to be quite large. Consequently, the resistor 3 and capacitor 6 are typically large, discrete components.

One problem with using a large capacitor is that the power-on reset circuitry must respond to disturbances to the power supply that, although brief, may be of sufficient magnitude to upset and invalidate the logic states of the circuitry. To accommodate these limited-duration power supply disturbances, often referred to as "brown outs", a diode 7 is connected across the resistor 3 so that it is reverse-biased during normal operation, but rapidly drains the capacitor 6 when the power supply voltage falls more than a diode drop below the voltage across the capacitor.

Even with the addition of the diode, however, the capacitor's selection represents a compromise between a capacitor that is large enough to assure a valid reset signal for the initial application of power, whether rapid or gradual, and one that permits a response to relatively brief power disturbances. Because it is impractical to produce large capacitors within integrated circuits (ICs) and because the rate at which power is applied to a system varies widely from application to application, this conventional circuit requires the use of external components, i.e., components not located within the IC, with all their attendant cost and reliability problems.

A complicating factor is that, in complementary metal-oxide-semiconductor (CMOS) circuits employing p-channel and n-channel field effect transistors (FETs), the threshold voltages for operation of the p-channel and n-channel devices are generally independent of each other, and can vary widely within a range of approximately 0.6–1.2 volts due to processing variations. This makes it very difficult to predict an accurate level for the termination of a power-on reset signal. If the signal is terminated at a voltage below the level at which all of the FETs are operative, the circuit may not function properly. If it is terminated significantly above the threshold levels, any circuit operation at all is sacrificed until the reset termination level is reached.

For the forgoing reasons, there is a need for a power-on reset indicator that eliminates external components, improves reliability, reduces cost and ensures, regardless of the rapidity with which power is supplied to the circuit, that the power supply voltage has reached a safe operating level before indicating to other circuitry that operation may commence.

A power-on reset circuit that satisfies these requirements is disclosed in U.S. Pat. No. 5,883,532 to Bowers and assigned to Analog Devices, Inc., the assignee of the present invention. In this patent a power-on reset circuit initiates a reset signal when the power supply voltage rises above a reset initiation level. The reset signal is terminated by a circuit that includes p-channel and n-channel FETs (PFETs and NFETs), having respective threshold voltages Vtn and Vtp, when the power supply voltage rises above the greater of Vtn and Vtp, plus an offset voltage that allows for fabrication tolerances.

While this approach is an improvement over prior power-on reset circuits, it is complicated to fabricate because it mixes CMOS reset circuitry with bipolar circuitry used to establish the voltage offset and to initiate the reset signal. This mixing of circuit technologies also adds to the fabrication cost.

SUMMARY OF THE INVENTION

The present invention provides a power-on reset circuit that retains the advantages of the Bowers patent, but does so with circuitry that is fully compatible with CMOS fabrication techniques. This avoids the mixing of fabrication technologies and its accompanying penalties in cost and fabrication complexity.

A reset signal is produced by an all-CMOS output circuit during a power-on transition. An all-CMOS control circuit that includes PFET and NFET devices terminates the reset signal when the power signal exceeds a reference voltage by more than the greater of the PFET and NFET threshold voltages (Vtp and Vtn). An FET-compatible circuit structure on the same substrate as the output and control circuits cooperates with the substrate to form an active bipolar device that establishes the reference voltage. This circuit structure is formed by the same process as the CMOS transistors and does not require any additional or different fabrication steps.

The bipolar device is preferably a diode-connected bipolar transistor, with the reference voltage provided by the transistor's base-emitter voltage. For this purpose the substrate can be doped to a first conductivity type, with the bipolar transistor comprising a source implant of the same first conductivity type which functions as its emitter, a channel well of opposite conductivity type which surrounds the source implant and functions as its base, and the substrate functioning as the collector.

In the preferred implementation the control circuit terminates the reset signal only when both of its PFET and NFET transistors are conductive, with one of the transistors inhibiting conduction of the other until it itself is conductive. The termination of the reset signal can be deliberately delayed, if desired, to ensure that a proper reset signal is established for rapidly rising supply voltages.

The new power-on reset circuit is particularly suited for integrated circuit applications, since no large capacitors or other discrete components are required. The circuit may, for example, be employed within an IC digital-to-analog converter (DAC) to place all of the DAC's registers in a known state at the time power is applied to it. This eliminates the need for a controller to "zero out" all the registers of all the DACs and other peripheral circuitry with which the controller interacts.

These and other features, aspects and advantages of the invention will be apparent to those skilled in the art from the following detailed description taken together with the accompanying drawings.

DETAILED DESCRIPTION OF THE INVENTION

Rather than relying on a time delay, the new power-on reset circuit employs all-CMOS circuitry, including both PFETs and NFETs to sense the circuit's power supply voltage, i.e., the voltage across high and low power terminals, and terminate a RESET signal in response to the power supply voltage exceeding the sum of a safety margin reference voltage and the greater of the PFET and NFET threshold voltages. The circuit is particularly suited to the control of CMOS circuits, but is also applicable to other kinds of circuitry. Since the power-on reset circuit is preferably integrated on the same chip as the CMOS circuitry which it controls, and is therefore subject to the same processing variations, the threshold voltages of the power-on reset FETs will tend to be the same as for the same type of FETs in the controlled circuitry. This enables the setting of a power-on reset termination level that closely approximates the operating threshold of the controlled circuit.

Figure 2:
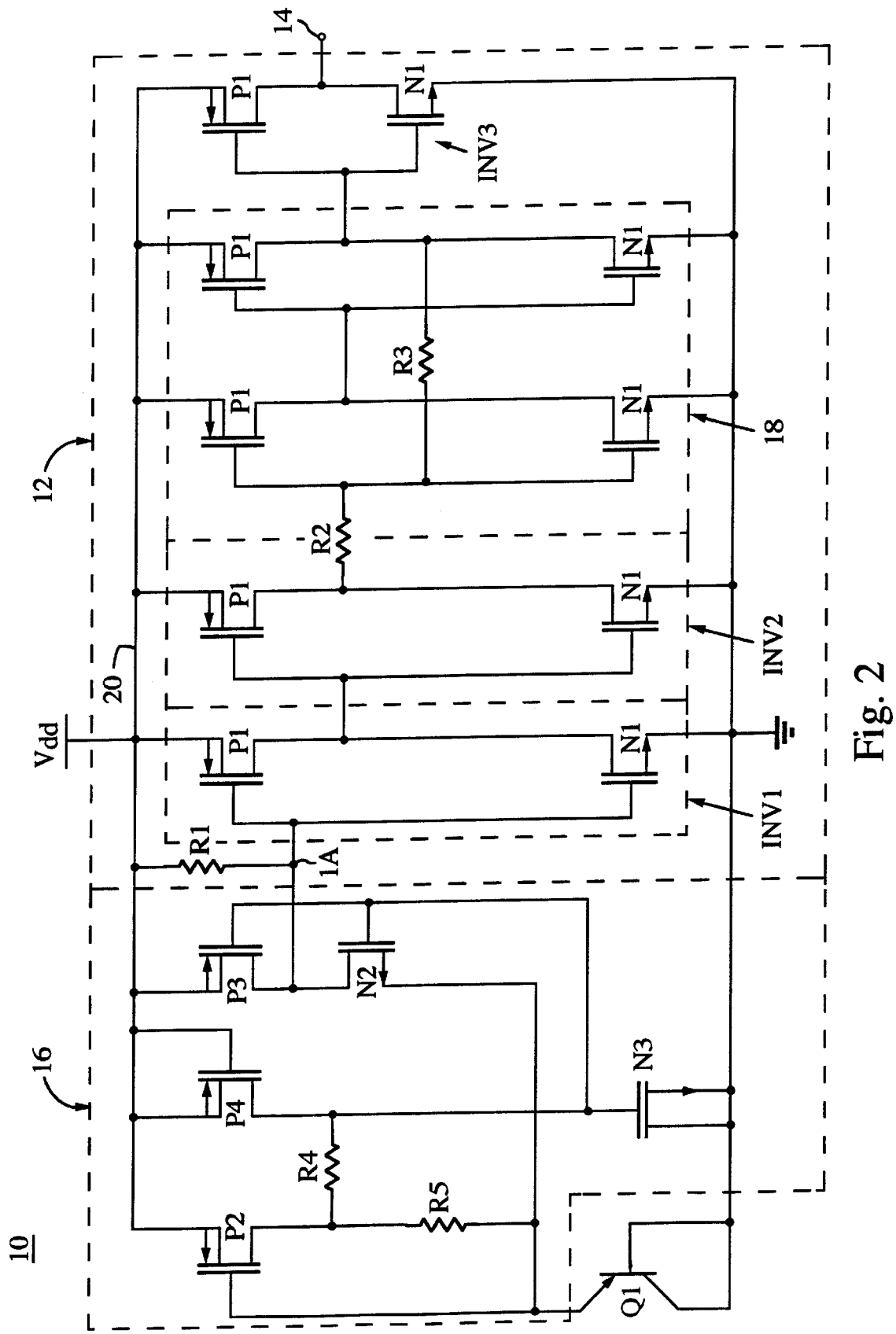
FIG. 2 is a schematic diagram of a new power-on reset circuit in accordance with the invention.

A preferred embodiment of the new power-on reset circuit 10 is shown in FIG. 2. An all-CMOS output circuit 12 provides a RESET signal at an output terminal 14 during a power-on transition, as the power supply voltage Vdd comes on and rises to a level adequate to safely drive circuitry connected to output terminal 14. An all-CMOS control circuit 16 terminates the RESET signal when Vdd has risen to a level that exceeds a reference voltage (established by transistor Q1) by more than the greater of the threshold voltages of PFET and NFET transistors included in the control circuit. The designation of these circuits as being "all-CMOS" refers to their active transistor elements, and not to passive elements such as resistors. Depending upon the nature of the controlled circuitry, the RESET signal which inhibits its operation may be either HI or LO, as discussed below.

The output circuit 12 includes a pair of gain stages in the form of series-connected inverter circuits INV1 and INV2, a hysteretic dual inverter circuit 18 with positive feedback that provides further gain and a hysteresis that inhibits jitter in the output due to transistory fluctuations in Vdd, and a final inverter stage INV3 which functions as an output drive circuit. The design of each inverter stage is preferably the same, consisting of a PFET P1 and an NFET N1, with the source of Pi connected to the Vdd supply line 20, the source of N1 connected to ground, the drains of P1 and N1 connected together, and the gates of P1 and Ni also connected together. Different gain stage configurations could also be used, or the circuit could be reconfigured to be connected between ground potential and a negative voltage supply rather than between positive voltage supply Vdd and ground. Furthermore, the designation of a "ground"potential is somewhat arbitrary, and can be taken to refer to any stable base voltage potential.

The input to INV1 is connected to Vdd through a resistor R1, while the output of INV2 is connected to the input of the hysteretic inverter stage 18 through a second resistor R2, and a third resistor R3 is connected between the output and input of stage 18 to provide positive feedback between its two internal inverters. The output drive circuit INV3 receives an input from the hysteretic inverter stage 18, and provides a RESET output to the output terminal 14 during the power-on transition.

Output circuit 12 maintains the RESET signal on output terminal 14 until Vdd has risen high enough to actuate the control circuit 16 to terminate the RESET signal. The basic control circuit elements involved in terminating a RESET signal are an NFET N2 and a PFET P2. The drain of N2 is connected to the drain of a PFET P3, whose source is connected to Vdd. The drain of N2 is also connected to one end of R1, the other end of which is connected to Vdd. P3 assists R1 in pulling up the voltage at N2's drain as Vdd rises, allowing it to track Vdd. The source of P2 is connected to Vdd, while its drain is connected through a resistor R4 to the gates of both N2 and P3.

When Vdd becomes active, it pulls the voltage at node A on the N2/P3 side of R1 to a HI level. Since there are an odd number of inverter stages in the output circuit 12, this produces a LO RESET signal at output terminal 14 that prevents circuitry controlled by terminal 14 from operating. If, on the other hand, the external circuitry is configured to be held off by a HI RESET signal, an even number of inverter stages could be provided.

As Vdd continues to rise, a level will be reached at which it is safe to remove the RESET signal and allow the external circuitry to operate. This is accomplished by the connection of node A to ground through the source-drain circuit of N2 and the base-emitter circuit of bipolar transistor Q1, which is preferably diode-connected by tying its base and collector together at ground potential. However, N2 can turn ON to establish this connection for node A only if the voltage at its gate exceeds the NFET threshold voltage for the circuit. The N2 gate voltage in turn is controlled by P2 and R4. With P2 OFF the N2 gate voltage is disconnected from Vdd and floats, preventing it from turning ON. However, P2 turns ON and conducts when Vdd at its source exceeds its gate voltage by at least Vtp. The P2 gate voltage in turn is set at the base-emitter voltage differential of bipolar transistor Q1 (approximately 0.6 volts). Thus, P2 will turn ON, pulling up the voltage at the gate of N2 to Vdd via R4, when Vdd exceeds the Q1 base-emitter reference voltage by at least Vtp.

Since the source of N2 is also offset from ground by the Q1 base-emitter reference voltage, its gate voltage must exceed the reference voltage by at least Vtn before N2 will turn ON. Thus, Vdd must exceed the reference voltage by at least the greater of Vtp and Vtn in order for N2 to turn ON and terminate the RESET pulse. If Vtp is greater than Vtn, N2 will turn ON as soon as P2 has turned ON and applied Vdd to the N2 gate. If, on the other hand, Vtn is greater than Vtp, N2 will remain OFF after P2 begins to conduct until Vdd reaches the sum of Vtn and the reference voltage. This assures that the external circuitry will remain RESET until Vdd exceeds the reference voltage by at least the greater of Vtn or Vtp, regardless of which is greater.

A potential problem exists if Vdd rises too fast. In this case the reset pulse may be too short, or perhaps not even be generated at all. One optional way of addressing this potential problem is to delay the operation of N2 for a period sufficient to ensure an adequate RESET pulse. One delay circuit that can be used for this purpose and preserves the all-CMOS nature of the control circuit is illustrated as NFET N3, which has its gate connected to the gate of N2 and both its source and drain tied together at ground potential. N3 functions as a capacitor, with its gate insulation acting as a dielectric and its gate and source/drain as opposed electrodes. The gate of N3 is connected through R4 and another resistor R5 to the emitter of Q1, thus establishing an RC delay circuit. N3 charges as the voltage at the gate of N2 rises, holds a turn-on voltage for N2 long enough to ensure an adequate RESET pulse, and then discharges through R4, R5 and Q1 to allow N2 to conduct. A normally reverse-biased diode-connected PFET P4 may be provided with its source and gate connected together to Vdd and its drain connected to the gate of N3 to ensure the discharge of N3 if Vdd is lost.

Figure 1:
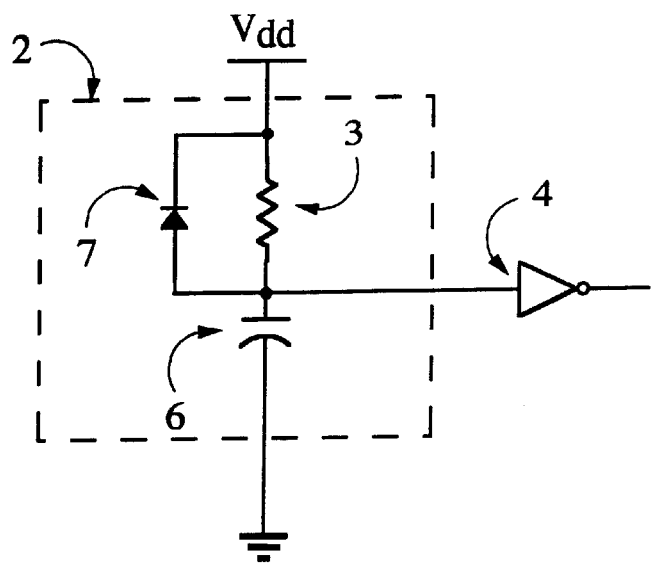
FIG. 1 is a schematic diagram of a conventional power-on reset circuit, described above.
Figure 3:
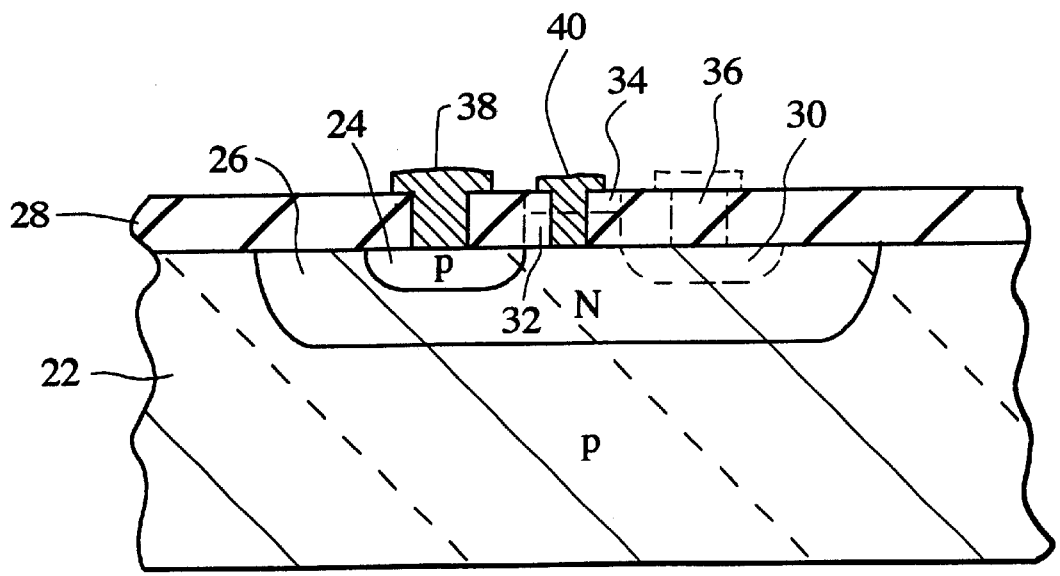
FIG. 3 is a not-to-scale sectional view illustrating a CMOS-compatible bipolar transistor structure employed in a preferred embodiment.

To preserve the all-CMOS character of the circuitry, bipolar transistor Q1 is implemented in a CMOS-compatible circuit structure such as that illustrated in FIG. 3. This circuit structure can be implemented with a CMOS process and does not require any additional processing or the changing of any of the usual CMOS processing steps. Q1 is formed on the same semiconductor substrate 22 as the rest of the power-on reset circuitry, and thus undergoes the same processing. While it is structurally compatible with normal CMOS processing, it is implemented with only a portion of an FET transistor, and that portion is connected in a non-standard manner so as to implement a diode-connected bipolar transistor. Structural elements that are normally included with an FET but are not used for Q1 are indicated by dashed lines in FIG. 3.

Assuming a p-type doping for the substrate 22 (the invention could also be made to work with opposite conductivity types), a p-type source region 24 is implanted into an n-well 26 in the upper portion of the substrate, which is capped by an insulating layer 28, typically silicon dioxide. The n-type well 26 normally functions as a channel between the source region 24 and a drain region 30, the latter region being indicated by a dashed line since it is not implemented for Q1. Also not implemented are a gate insulating layer 32, a gate contact 34 and a drain contact 36. Rather, the usual source contact 38 is made through insulating layer 28 to p-type source region 24, which serves as the emitter of Q1, and another contact 40 is made through the insulating layer to the n-well 26, which serves as the base of Q1. Although base contact 40 is not normally implemented in an FET, it can be formed in the same step as emitter contact 38 and thus requires no additional processing. The p-type substrate 22 functions as the collector of Q1 and, as indicated in FIG. 2, is electrically shorted to the transistor base.

Typical ohmic values for the various resistors of FIG. 2 are:

R1 350K
R2 10K
R3 60K
R4 100K
R5 350K

If Vdd increases very slowly, the voltage at the output of inverter INV2 may linger at an indeterminate voltage for some time, and one or both of the FETs P1 and N1 of the first inverter in the hysteretic inverter circuit 18 may conduct. The resistor network consisting of R2 and R3 forms a positive feedback loop which creates distinct high and low input threshold levels for the first inverter in circuit 18, so that a RESET termination is maintained until Vdd has dropped to a hysteresis level below the RESET termination threshold for a rising Vdd, thereby eliminating indeterminate voltage levels.

Figure 4:
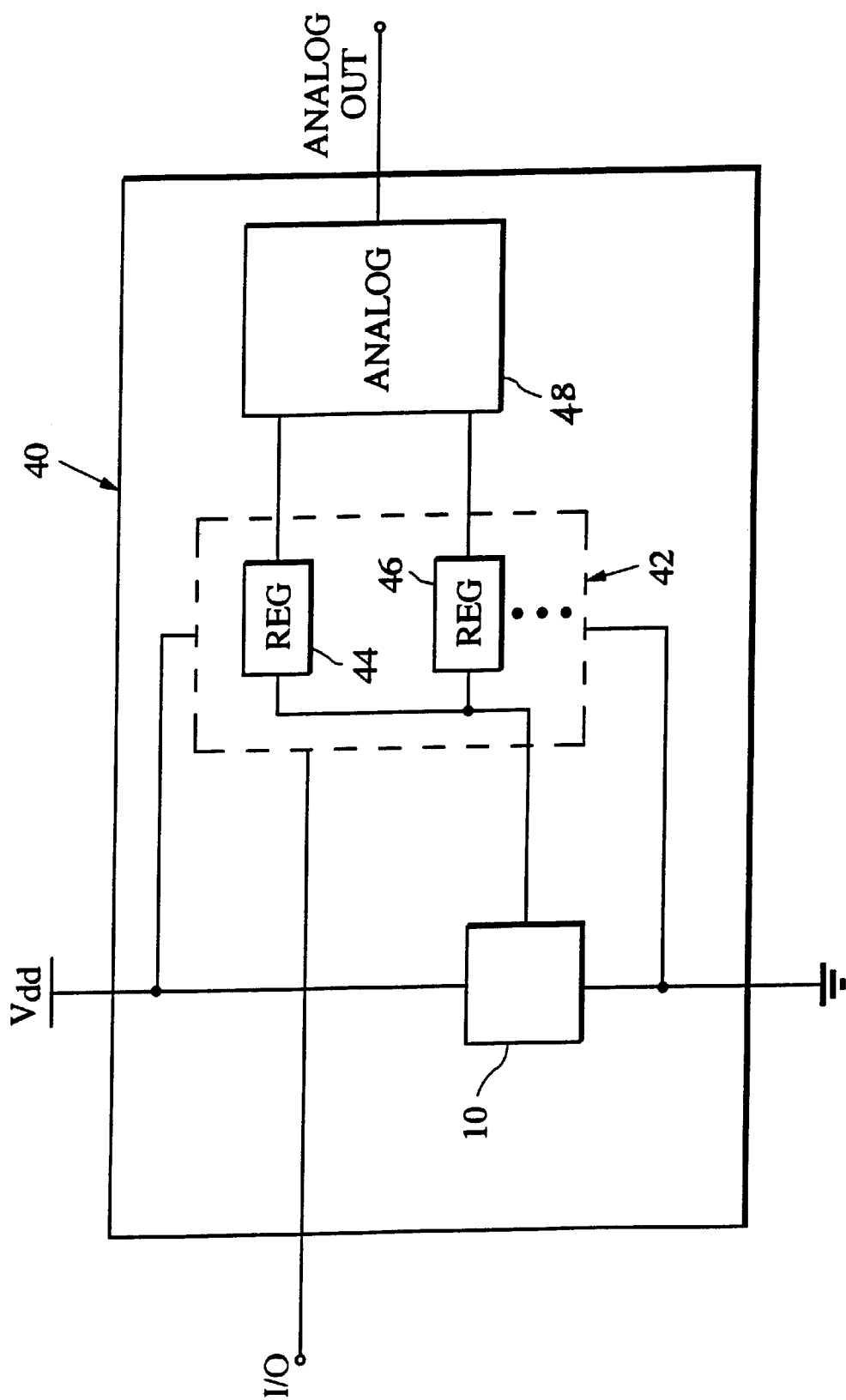
FIG. 4 is a block diagram of a DAC which incorporates the new power-on reset circuit.

FIG. 4 illustrates a DAC 40 which employs the new power-on reset circuit 10. Digital signals are exchanged between the DAC and other circuitry (not shown) through the digital interface labeled I/O. Digital circuitry 42 within the DAC derives power from the same power supply terminals Vdd and gnd as the power-on reset circuit 10. The digital circuitry 42 includes registers 44 and 46 which typically employ CMOS flip-flop circuits, and which are connected to an analog circuit section 48. The analog circuit section generally includes voltage references and resistor ladders which are combined to produce an analog output signal, labeled ANALOG OUT, that corresponds to the digital values stored within the registers 44, 46. DACs and the interaction between such digital and analog circuit sections are known; for a discussion of resistor ladders and their application to DACs, see Horowitz and Hill, *The Art of Electronics*, 2d edition, Cambridge University Press, New York, 1991, pages 614–616.

The output of the power-on reset circuit 10 is distributed to the digital circuitry 42. In the preferred embodiment the reset signal is used to set digital values within the registers 44 and 46 to respective predetermined values, typically zero.

Since the digital interface I/O may be a relatively slow serial interface and there may be many DACs such as DAC 40 controlled by a microprocessor within a given system, this automatic pre-setting of the registers 44 and 46 to predetermined values relieves the microprocessor of the potentially significant and time-consuming burden of setting all of the registers in all of the DACs to a preferred initial value. In the absence of the hysteresis circuit 18 the output of inverter INV2 would be applied to the registers.

While particular embodiments of the invention have been shown and described, numerous variations and alternate embodiments will occur to those skilled in the art. Accordingly, it is intended that the invention be limited only in terms of the appended claims.

We claim:

1. A digital-to-analog converter (DAC) which derives power from a power source having a supply voltage Vdd, comprising:
    a digital circuit section including CMOS circuitry composed of p-channel and n-channel field effect transistors (FETs) characterized by respective threshold voltages, said digital circuit section connected to receive digital data,
    an analog output section connected to produce analog output signals corresponding to the digital values of said digital data,
    an all-CMOS circuit connected to provide an output reset signal to said digital circuit section during a power-on transition,
    an all-CMOS control circuit that includes PFET and NFET transistors connected to terminate said reset signal when an applied power signal has reached a voltage that exceeds a reference voltage by at least the greater of the threshold voltages of said PFET and NFET transistors, but less than the sum of said threshold voltages, and
    an FET-compatible circuit structure that is connected to establish said reference voltage.

2. The DAC of claim 1, wherein said active bipolar device comprises a diode.

3. The DAC of claim 1, wherein said output circuit, control circuit and circuit structure are forward on a common semiconductor substrate, and said circuit structure cooperates with said substrate to form a bipolar transistor.

4. The DAC of claim 3, wherein said bipolar transistor is diode-connected to establish said reference voltage as a base-emitter voltage.

5. The DAC of claim 3, wherein said substrate is doped to a first conductivity type, and said bipolar transistor comprises a source implant of said first conductivity type which functions as its emitter, a channel well of opposite conductivity type which surrounds said source implant and functions as its base, and said substrate functioning as its collector.

6. A power-on reset circuit for providing a reset signal during power-on and terminating the reset signal when an adequate power level has been reached, comprising:
    an all-CMOS output circuit connected to provide an output reset signal during a power-on transition, and
    an all-CMOS control circuit that includes PFET and NFET transistors connected to terminate said reset signal when an applied power signal has reached a voltage that exceeds a reference voltage by at least the greater of the threshold voltages of said PFET and NFET transistors, but less than the sum of said threshold voltages.

7. The power-on reset circuit of claim 6, said output circuit comprising a hysteretic inverter circuit.

8. The power-on reset circuit of claim 6, said control circuit terminating said reset signal only when both its PFET and NFET transistors are conductive.

9. The power-on reset circuit of claim 8, said control circuit further including a delay circuit that causes said output circuit to continue to provide a reset signal for a delay period after said PFET and NFET transistors have both become conductive.

10. The power-on reset circuit of claim 8, wherein said reference voltage is offset from ground to allow circuitry controlled by said reset signal and powered by said power signal to have different threshold levels from said PFET and NFET transistors.

11. The power-on reset circuit of claim 8, wherein said PFET and NFET transistors are connected so that one of said transistors is inhibited from being conductive until the other of said transistors is conductive.

12. The power-on reset circuit of claim 11, wherein said PFET is connected to inhibit said NFET from being conductive until the PFET is conductive.

* * * * *